US012711293B2

(12) United States Patent
Kehlet et al.

(10) Patent No.: US 12,711,293 B2
(45) Date of Patent: Aug. 18, 2026

(54) TECHNIQUES FOR REPLACING LOGIC CIRCUITS IN MODULES WITH CONFIGURABLE CIRCUITS

(71) Applicant: Intel Corporation, Santa Clara, CA (US)

(72) Inventors: David Kehlet, Los Altos Hills, CA (US); Nij Dorairaj, Campbell, CA (US)

(73) Assignee: Altera Corporation, San Jose, CA (US)

( * ) Notice: Subject to any disclaimer, the term of this patent is extended or adjusted under 35 U.S.C. 154(b) by 90 days.

(21) Appl. No.: 18/124,259

(22) Filed: Mar. 21, 2023

(65) Prior Publication Data

US 2023/0222274 A1 Jul. 13, 2023

Related U.S. Application Data

(60) Provisional application No. 63/355,566, filed on Jun. 24, 2022.

(51) Int. Cl.
*G06F 30/323* (2020.01)

(52) U.S. Cl.
CPC .................................. *G06F 30/323* (2020.01)

(58) Field of Classification Search
USPC .......................................................... 716/103
See application file for complete search history.

(56) References Cited

U.S. PATENT DOCUMENTS 8,402,401 B2 3/2013 Chakraborty et al.
10,691,856 B1 6/2020 Lysaght et al.
11,562,117 B2 1/2023 Dorairaj et al.
2004/0196065 A1* 10/2004 Madurawe ............ G06F 30/394 326/41
2006/0158217 A1* 7/2006 Madurawe .............. G06F 30/30 326/39
2007/0152708 A1* 7/2007 Madurawe ............. H10B 10/12 326/39
2011/0154062 A1 6/2011 Whelihan et al.
2021/0192018 A1 6/2021 Bhunia et al.

(Continued)

OTHER PUBLICATIONS

Tamzidul Hoque, et al., "Hardware Obfuscation and Logic Locking: A Tutorial Introduction," IEEE CEDA, IEEE CASS, IEEE SSCS, and TTTC, Date of publication: Mar. 30, 2020; date of current version: Jun. 24, 2020, pp. 59-77.

(Continued)

*Primary Examiner* — Mohammed Alam
(74) *Attorney, Agent, or Firm* — InventIQ Legal LLP; Steven J. Cahill

(57) ABSTRACT

A computer system is provided for protecting a circuit design for an application specific integrated circuit. The computer system includes a logic circuit replacement tool for identifying a module of logic circuitry for replacement in at least a portion of the circuit design. The logic circuit replacement tool generates a transformed circuit design for the application specific integrated circuit by replacing the logic circuitry in the module with a configurable circuit that performs a logic function of the logic circuitry when a bitstream stored in storage circuits in the configurable circuit configures the configurable circuit. The transformed circuit design includes the configurable circuit in the module.

20 Claims, 7 Drawing Sheets

(56) References Cited

U.S. PATENT DOCUMENTS

2022/0198108 A1 6/2022 Bhunia et al.

OTHER PUBLICATIONS

T. Winograd et al. "Hybrid STT-CMOS Designs for Reverse-engineering Prevention," ACM DAC Jun. 5-9, 2016, Austin, TX, 6 pages. (Year: 2016).
M. Yasin et al., "CamoPerturb: Secure IC Camouflaging for Minterm Protection," ACM ICCAD Nov. 7-10, 2016 Austin, TX, 8 pages.
H.M. Kamali et al., "LUT-Lock: A Novel LUT-based Logic Obfuscation for FPGA Bitstream and ASIC-Hardware Protection," 2018 IEEE Computer Society Annual Symposium on VLSI, pp. 405-410. (Year: 2018).
J. Zhang, "A Practical Logic Obfuscation Technique for Hardware Security," IEEE Trans. on VLSI Systems, vol. 24, No. 3, Mar. 2016, pp. 1193-1197. (Year: 2016).
V.V. Menon et al., "System-Level Framework for Logic Obfuscation with Quantified Metrics for Evaluation," 2019 IEEE Secure Developement (SecDev), IEEE Computer Society, pp. 89-100.
Bo Hu et al., "Functional Obfuscation of Hardware Accelerators through Selective Partial Design Extraction onto an Embedded FPGA," Great Lakes Symposium on VLSI '19, May 9-11, 2019, Tech Session 7, pp. 171-176.
T. Winograd et al. "Preventing Design Reverse Engineering with Reconfigurable Spin Transfer Torque LUT Gates," 17th Int'l Symposium on Quality Electronic Design, 2016, pp. 1-6.

* cited by examiner

TECHNIQUES FOR REPLACING LOGIC CIRCUITS IN MODULES WITH CONFIGURABLE CIRCUITS

CROSS-REFERENCE TO RELATED APPLICATIONS

This patent application claims the benefit of U.S. provisional patent application No. 63/355,566, filed Jun. 24, 2022, which is incorporated by reference herein in its entirety.

STATEMENT OF GOVERNMENT INTEREST

This Invention was made with Government support under Agreement No. N00164-19-9-0001, awarded by NSWC Crane Division. The Government has certain rights in the Invention.

TECHNICAL FIELD

The present disclosure relates to electronic circuit systems and methods, and more particularly, to systems and methods for replacing logic circuits in modules with configurable circuits in a circuit design for an integrated circuit.

BACKGROUND

Theft, reverse engineering, and piracy of intellectual property for hardware electronic circuits is a significant issue worldwide. Therefore, there is a need to protect designs for electronic circuits before and after manufacture and distribution. Hardware obfuscation is a method of modifying a design for an electronic circuit to generate an obfuscated design that is intended to be difficult to reverse engineer or copy. Traditional protection uses an obfuscator and a key that transforms the original design to the obfuscated design. The functionality of the original design can be determined by applying the correct key to the obfuscated design.

DETAILED DESCRIPTION

Figure 1:
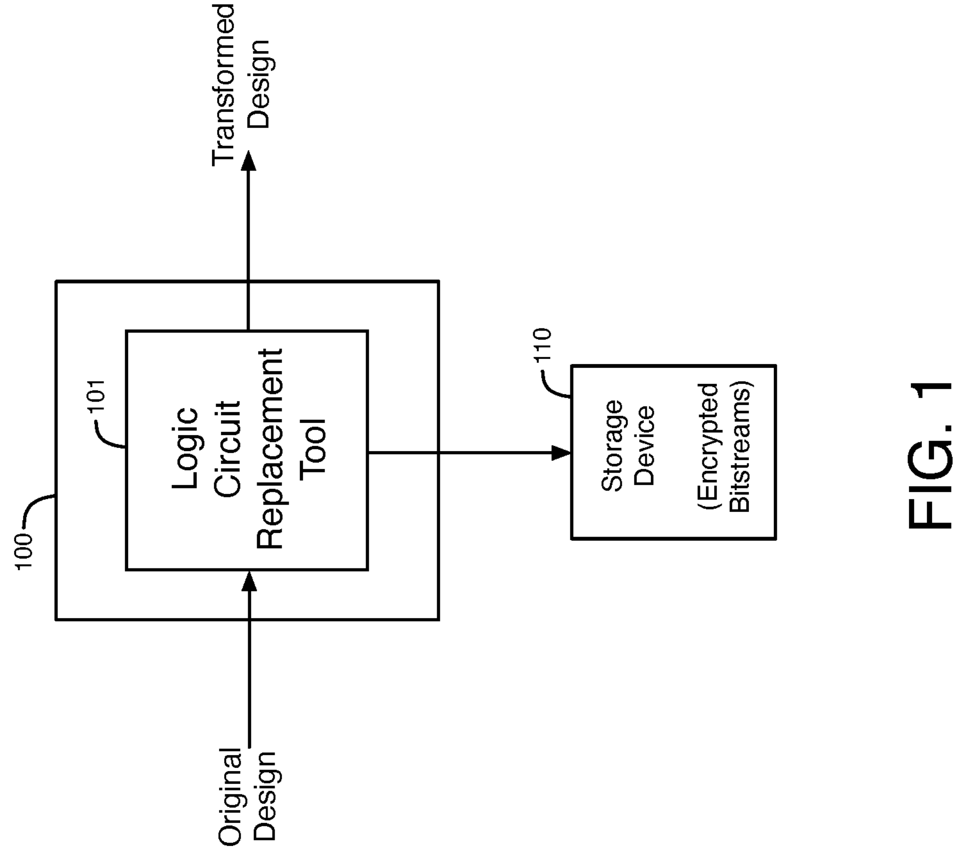
FIG. 1 illustrates an example of a redaction system that replaces logic circuits in one or more modules of a circuit design for an application specific integrated circuit (ASIC) with one or more configurable circuits that are programmable by one or more bitstreams.

As discussed above, hardware obfuscation attempts to protect a design for an electronic integrated circuit (also referred to herein as a circuit design) by modifying the circuit design using a key to generate an obfuscated design that is difficult to reverse engineer without access to the key. However, an untrusted party may obtain unauthorized access to the key that enables the original design to be determined from the obfuscated design. Also, because untrusted parties may have access to an obfuscated design, it is possible that a determined attacker may be able to implement an attack that can discover the functionality of the original design from the obfuscated design without having access to the key.

Many large system-on-chip (SOC) designs are built by assembling multiple intellectual property (IP) blocks on an integrated circuit. Some of the IP blocks may carry design secrets. It is important that these design secrets not be compromised by reverse engineering methods during the manufacturing and testing of the SOC.

A circuit design for an electronic application specific integrated circuit (ASIC) can have several modules of logic circuits. The logic circuits in each module can be coupled together to perform a logic function or related logic functions. The modules of logic circuits can, for example, be a arranged in a hierarchy.

According to some examples disclosed herein, systems and methods are provided for removing and replacing logic circuits in one or more modules in an original circuit design for an ASIC with one or more configurable circuits that are configured by one or more bitstreams to perform the same functions as the replaced logic circuits. The logic circuits in multiple modules in the original circuit design can be replaced with configurable circuits that are configured by bitstreams. The modules are functional when functional bitstreams are loaded into the configurable circuits. The modules can be made to be non-functional by loading bitstreams with all zero values into the configurable circuit. The redacted modules cannot easily be reverse engineered. Therefore, modules that perform secret functions can be redacted to prevent discovery. This redaction technique can be applied to any size module of logic circuits. The routing between the modules of configurable circuits can, for example, be fixed and non-programmable.

The design is implemented, manufactured, and tested in a standard ASIC flow with the replaced module(s). During power-up of the ASIC, one or more bitstreams are loaded into the configurable circuits to make the circuit design functional. The one or more bitstreams are not stored in the ASIC. Instead, the one or more bitstreams are stored in a separate device and provided only to trusted parties. The one or more bitstreams can be cryptographically protected. The one or more bitstreams can be transmitted to the ASIC and stored in the configurable circuits during operation of the ASIC. When the configurable circuits are programmed by the one or more bitstreams, the circuit design transformed with the configurable circuits can implement the same functions as the original circuit design.

Because the one or more bitstreams are not stored in the ASIC, an attacker cannot learn the functions of the original circuit design merely by having access to the ASIC. Anyone who has the ASIC but not the bitstreams cannot reconstruct the original circuit design or the functionality of the original circuit design. As an example, a facility that fabricates integrated circuits may have the physical design of an integrated circuit, the netlist of the physical design, and test vectors for the physical design. However, with the redaction system disclosed herein, the fabrication facility does not need to have access to the bitstreams, because the bitstreams are not needed for the fabrication or test of the integrated circuit. Without access to the bitstreams, individuals at the fabrication facility are not able to reverse engineer the functions of the original circuit design.

Throughout the specification, and in the claims, the term "connected" means a direct electrical connection between the circuits that are connected, without any intermediary devices. The term "coupled" means either a direct electrical connection between circuits or an indirect electrical connection through one or more passive or active intermediary devices. The term "circuit" may mean one or more passive and/or active electrical components that are arranged to cooperate with one another to provide a desired function.

One or more specific examples are described below. In an effort to provide a concise description of these examples, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure (FIG. 1 illustrates an example of a redaction system 100 that replaces logic circuits in one or more modules of a circuit design for an application specific integrated circuit (ASIC) with configurable circuits that are configurable by one or more bitstreams. Redaction system 100 includes a logic circuit replacement tool 101. Redaction system 100 can, for example, include one or more computer systems. The computer system(s) in redaction system 100 can include, for example, one or more processor circuits, storage/memory circuits, graphics processing circuits, programmable logic integrated circuits, input/output devices, and busses that connect these components together. Logic circuit replacement tool 101 can include computer hardware components and software tools that are implemented in one or more computer systems in redaction system 100. An original circuit design (also referred to herein as an original design) is provided to the redaction system 100 as shown in FIG. 1. The original design is a circuit design for at least a portion of (or all of) an electronic application specific integrated circuit (ASIC). The original design is provided to logic circuit replacement tool 101.

The redaction system 100 redacts the intent of the original design to generate a transformed design for the integrated circuit using logic circuit replacement tool 101. Logic circuit replacement tool 101 transforms the original design by replacing the logic circuits in one or more modules in the original design (e.g., critical modules of the original design) with configurable circuits in the modules. The configurable circuits can include sequential storage circuits and logic circuits, such as lookup tables. Tool 101 generates a bitstream that can be stored in the configurable circuits and used to configure the configurable circuits to cause the configurable circuits to perform the logic functions of the logic circuits replaced in the original design. The configurable circuits perform the same logic functions as the logic circuits replaced in the original design when the bitstream is stored in the configurable circuits and used to configure the configurable circuits. The configurable circuits cannot perform the logic functions of the logic circuits replaced in the original design without the bitstream. Redaction system 100 can replace the logic circuits with configurable circuits prior to synthesis and physical implementation of the circuit design.

The logic circuit replacement tool 101 removes the logic circuits in one or more modules of logic circuits in the original design and replaces the removed logic circuits with configurable circuits that perform the same logic functions as the removed logic circuits when a bitstream is stored in the configurable circuits and used to configure the configurable circuits. As examples, the configurable circuits can be lookup-tables (LUTs) that perform combinatorial logic functions. Tool 101 can vary the number of modules of logic circuits removed in the original design and replaced with configurable circuits based on the complexity of the original design. In some exemplary embodiments, tool 101 can only replace a small fraction (e.g., 10-30%) of the original design with configurable circuits configurable by a bitstream.

The bitstreams can be cryptographically protected. The bitstreams are provided only to trusted parties to prevent unauthorized access to the original design. The bitstreams are initially not stored in the integrated circuit containing the configurable circuits. Instead, the bitstreams (e.g., an encrypted version of the bitstreams) are transferred to and stored in an external storage device 110, as shown in FIG. 1. Only an authorized party who has access to the bitstreams can provide the bitstreams from the storage device 110 to the integrated circuit for storage in the configurable circuits.

A party who has access to the integrated circuit, but not the bitstreams, cannot reconstruct the original design. For example, an integrated circuit fabrication facility may have a physical circuit design, a netlist, and test vectors for the circuit design for an integrated circuit. With the embodiment of FIG. 1, the fabrication facility does not have access to the bitstreams, because the bitstreams are not needed for fabrication or testing of the integrated circuit. Without the bitstreams, the original design is not available to a potential attacker at the fabrication facility. In some examples, an additional verification process can be performed after logic circuit replacement tool 101 generates the transformed design to ensure that the function of the original design can be reproduced by applying the bitstreams to the transformed design.

During operation, executable software, such as the software of logic circuit replacement tool 101, runs on the processor(s) of redaction system 100. Databases can be used to store data for the operation of system 100. In general, software and data can be stored in non-transitory computer readable storage media (e.g., tangible computer readable storage media). The software code may sometimes be referred to as software, data, program instructions, instructions, or code. The non-transitory computer readable storage media can include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s). Software stored in the non-transitory computer readable storage media can be executed in redaction system 100. When the software of redaction system 100 is installed, the storage of redaction system 100 has instructions and data that cause the computing equipment in redaction system 100 to execute various methods (processes). When performing these processes, the computing equipment is configured to implement the functions of redaction system 100.

In an ASIC, a fabric of lookup table (LUT) circuits can be built for a specific circuit design. The fabric of LUT circuits can offer the flexibility of choosing an optimal circuit structure that uses less die area and has increased performance than programmable logic based on the circuit design constraints. This flexibility allows a circuit designer to choose a variable LUT sizing that is suitable for a given circuit design for an ASIC. Variable sized LUT mapping can be dynamically determined for different modules or submodules of a circuit design for an ASIC. For example, a circuit design with wider and/or larger logic functions may benefit from using larger LUT circuits. A larger LUT circuit may be more optimal in terms of circuit die area and signal delay, than smaller LUT circuits.

Figure 2A:
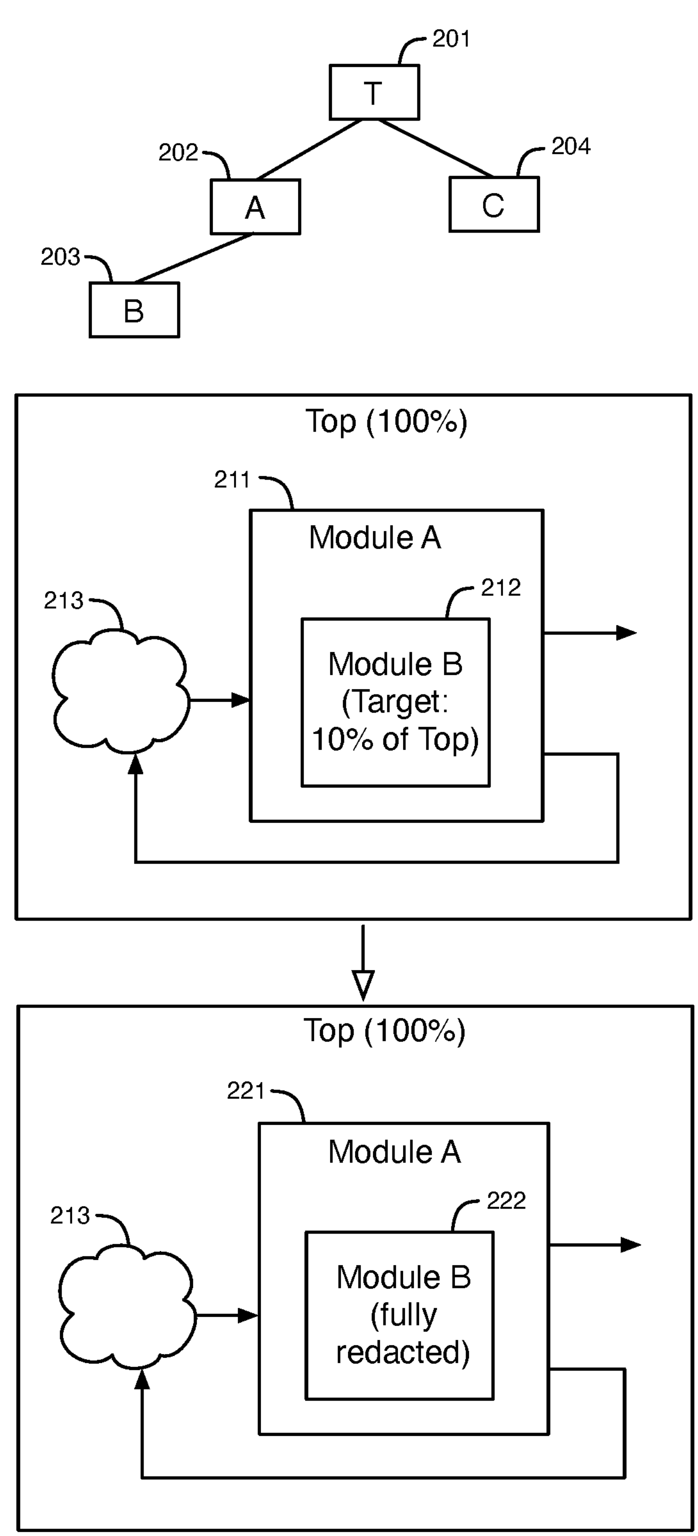
FIG. 2A is a diagram that illustrates an example of how the redaction system of Figure (FIG. 1 can redact a submodule of logic circuits within a module of logic circuits in a hierarchy of modules of logic circuits in a circuit design for an integrated circuit.

In some implementations, redaction system 100 of FIG. 1 can replace logic circuits in modules that are arranged in a hierarchy in a circuit design for an ASIC with configurable circuits in the ASIC. FIG. 2A is a diagram that illustrates an example of how redaction system 100 can redact a submodule of logic circuits within a module of logic circuits in a hierarchy of modules of logic circuits in a circuit design for an integrated circuit. FIG. 2A illustrates an example of a circuit design, or a portion of a circuit design, for an ASIC that includes 4 modules of logic circuits that are arranged in a hierarchy. The 4 modules are module T 201, module A 202, module B 203, and module C 204. The 4 modules 201-204 are coupled together through hardwired (non-programmable) routing (i.e., couplings). In the example of FIG. 2A, modules A and C are sub-modules of module T (Top), and module B is a sub-module of module A. Thus, each of modules A and C includes a subset of the logic circuits within module T, and module B includes a subset of the logic circuits in module A. According to some examples, redaction system 100 can replace the logic circuits in one or more of the modules T, A, B, and/or C with configurable circuits (e.g., LUTs) that are configurable by associated bitstreams, as disclosed herein with respect to FIG. 1.

The T (Top) module 201 includes 100% of the logic circuits within the hierarchy of modules of logic circuits shown in FIG. 2A. The original design 211 for module A 202 contains the original target design 212 for module B 203. In the example of FIG. 2A, module T 201 includes logic circuitry 213 (e.g., module C) and module A. Logic circuitry 213 receives an input from module A and provides an output to module A. Module B includes 10% of the logic circuitry in module T (Top).

Redaction system 100 redacts the original target design 212 for module B to generate a fully redacted design 222 for module B as shown in FIG. 2A by replacing the original target design 212 for module B with configurable circuits (e.g., LUTs) in fully redacted design 222. The configurable circuits in fully redacted design 222 are configurable by a bitstream to perform the logic functions of the logic circuits replaced in the original design 212. The transformed design 221 for module A includes the fully redacted design 222 for module B.

According to some examples, the logic circuits in modules arranged in a hierarchy can be replaced with lookup table (LUT) circuits having different sizes. In these examples, the logic circuits in one module in the hierarchy can be replaced with a LUT circuit having a first size, the logic circuits in a second module in the hierarchy can be replaced with a LUT circuit having a second size that is different than the first size, the logic circuits in a third module in the hierarchy can be replaced with a LUT circuit having a third size that is different than the first and second sizes, etc. LUT circuits that have different sizes have different numbers of inputs and different numbers of multiplexer circuits. The selection of the different LUT sizes used to replace the logic circuits in modules in a hierarchy is based on characteristics of the circuit design for the ASIC. The size of each lookup table (LUT) circuit can be determined by parsing the netlist graph of the circuit design and annotating the maximum LUT size for each module based on the design constraints. Then, the structure of each LUT can be determined.

Figure 2B:
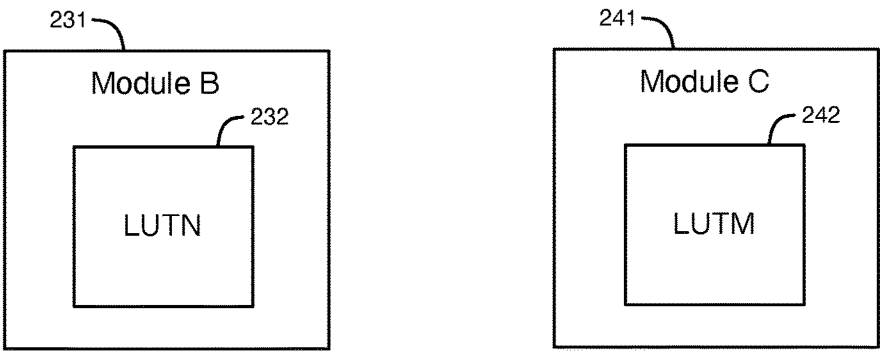
FIG. 2B is a diagram that illustrates an example of how a redaction system can replace the logic circuits in modules arranged in a hierarchy with lookup table circuits that have different sizes.

FIG. 2B is a diagram that illustrates an example of how redaction system 100 can replace the logic circuits in modules arranged in a hierarchy with LUT circuits that have different sizes. In the example of FIG. 2B, redaction system 100 replaces the logic circuits 231 in module B in the hierarchy shown in FIG. 2A with a lookup table circuit LUTN 232, and redaction system 100 replaces the logic circuits 241 in module C in the hierarchy shown in FIG. 2A with a lookup table circuit LUTM 242. LUTM 242 has a different size than LUTN 232, including a different number of inputs and a different number of multiplexer circuits.

In an alternative implementation, redaction system 100 replaces logic circuits in a first module in a circuit design for an ASIC with a LUT circuit having a first size, redaction system 100 replaces logic circuits in a second module in the circuit design with a LUT circuit having a second size different than the first size, and the second module is a sub-module of the first module in a hierarchy. For example, module C in FIG. 2B can be a sub-module of module B.

Figure 2C:
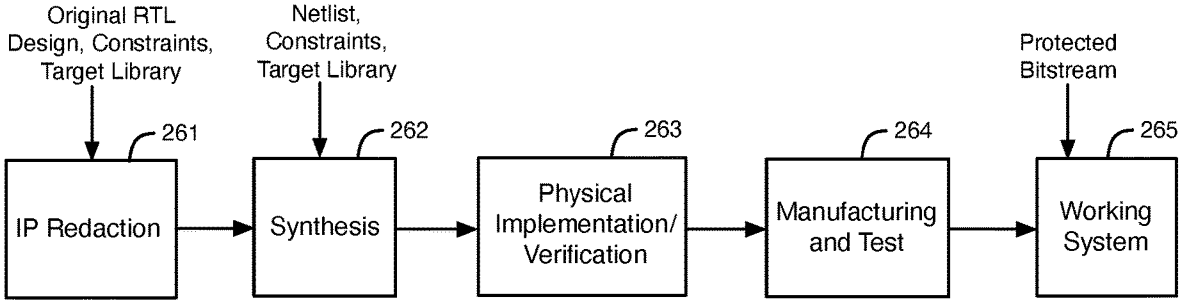
FIG. 2C is a flow chart that illustrates examples of operations that can be performed to generate an ASIC having a redacted circuit design using the redaction system of FIG. 1.

FIG. 2C is a flow chart that illustrates examples of operations that can be performed to generate an ASIC having a redacted circuit design using the redaction system 100 of FIG. 1. In operation 261, the redaction system 100 redacts an original circuit design (e.g., an original RTL design) for an ASIC using constraints (e.g., for timing, voltage, floorplan, etc.) for the circuit design, and a target library of circuit blocks to generate a redacted circuit design. In operation 262, a synthesis tool performs synthesis of the redacted circuit design using a netlist (e.g., a Verilog netlist), constraints (e.g., for timing, voltage, floorplan, etc.) for the circuit design, and a target library of circuit blocks to generate a synthesized circuit design (i.e., a gate-level netlist). In operation 263, computer aided design tools can be used to perform physical implementation and verification of the synthesized circuit design. In operation 264, the ASIC is manufactured with the physically implemented, verified, and synthesized redacted circuit design generated in operations 261-263. The manufactured ASIC is then tested. The manufactured and tested ASIC can then be implemented in a working system 265. The ASIC can be made to be functional by loading a functional (protected) bitstream into the ASIC to configure the configurable circuits as disclosed herein.

Figure 3A:
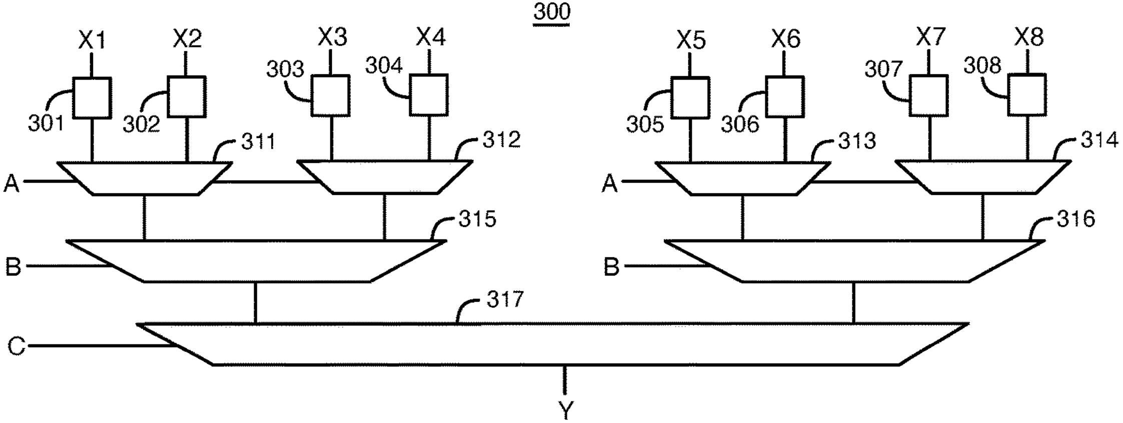
FIG. 3A is a diagram of an example of a 3-input lookup table (LUT) circuit that can be used for redacting a portion of a circuit design for an ASIC.

To redact a circuit design for an ASIC, logic circuits in the circuit design can be replaced with configurable circuits that include multiplexer circuits and register circuits. The register circuits store a bitstream during operation that implements one or more logic functions (e.g., Boolean logic functions) in the circuit design. FIG. 3A is a diagram of an example of a 3-input lookup table (LUT) circuit 300 that can be used for redacting a portion of a circuit design for an ASIC. The 3-input LUT circuit 300 of FIG. 3A includes 8 register circuits 301-308 and 7 multiplexer circuits 311-317. Each of the register circuits 301-308 is a sequential storage circuit that stores the value of a bit in a bitstream in response to a clock signal. The bitstream is generated by a source external to the ASIC and is loaded into the register circuits 301-308 as signals X1-X8, respectively, during operation of the ASIC to configure the LUT circuit 300 to perform a desired logic function.

Each of the multiplexer circuits 311-317 is a 2-to-1 multiplexer circuit. Three unique select signals A-C are provided to select inputs of multiplexer circuits 311-317. Select signals A-C are generated by other logic circuits in the circuit design for the ASIC during the operation of the ASIC. Select signal A is provided to a select input of each of multiplexer circuits 311-314. Select signal B is provided to a select input of each of multiplexer circuits 315-316. Select signal C is provided to the select input of multiplexer circuit 317. Select signals A, B, and C control the selections of the multiplexer circuits 311-314, 315-316, and 317, respectively. Multiplexer circuit 317 generates the output signal Y of the LUT 300 at its output. As used herein, the number of unique select signals that can be provided to a LUT circuit equals the number of LUT inputs. For example, LUT circuit 300 is a 3-input LUT, because LUT circuit 300 receives three unique select signals A, B and C.

Figure 3B:
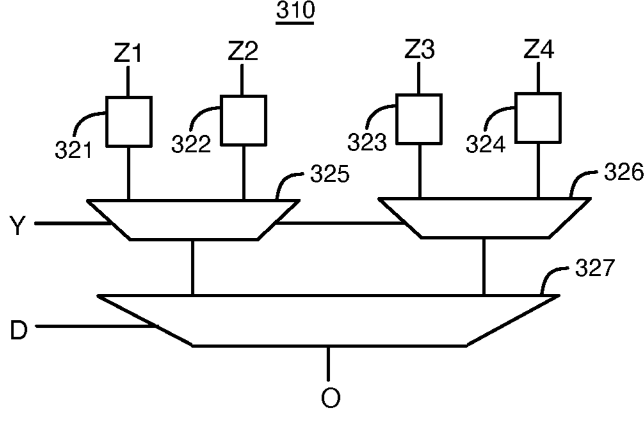
FIG. 3B is a diagram of an example of a 2-input lookup table (LUT) circuit that can be used for redacting a portion of a circuit design for an ASIC.

FIG. 3B is a diagram of an example of a 2-input lookup table (LUT) circuit 310 that can be used for redacting a portion of a circuit design for an ASIC. The 2-input LUT circuit 310 of FIG. 3B includes 4 register circuits 321-324 and 3 multiplexer circuits 325-327. Each of the register circuits 321-324 is a sequential storage circuit that stores the value of a bit in a bitstream in response to a clock signal. The bitstream is generated by a source external to the ASIC and is loaded into the register circuits 321-324 as signals Z1-Z4, respectively, during operation of the ASIC to configure the LUT circuit 310 to perform a desired logic function.

Each of the multiplexer circuits 325-327 is a 2-to-1 multiplexer circuit. Two unique select signals D and Y are provided to select inputs of multiplexer circuits 325-327. Select signals D and Y are generated by other logic circuits in the circuit design for the ASIC during the operation of the ASIC. Select signal Y is provided to a select input of each of multiplexer circuits 325-326. Select signal D is provided to the select input of multiplexer circuit 327. Select signals Y and D control the selections of the multiplexer circuits 325-326 and 327, respectively. Multiplexer circuit 327 generates the output signal O of the LUT 310 at its output.

In some implementations, the LUT circuits that redaction system 100 selects to replace the logic circuits in a circuit design for an ASIC can be analyzed for area and timing slack during a post processing optimization procedure. During this optimization procedure, one or more of the LUT circuits can be replaced with LUT circuits having different sizes in order to optimize the die area or delay of the LUT circuits. As an example, a larger LUT circuit can be replaced with multiple smaller LUT circuits during this optimization procedure to reduce the die area usage and power consumption of the ASIC.

Figure 3C:
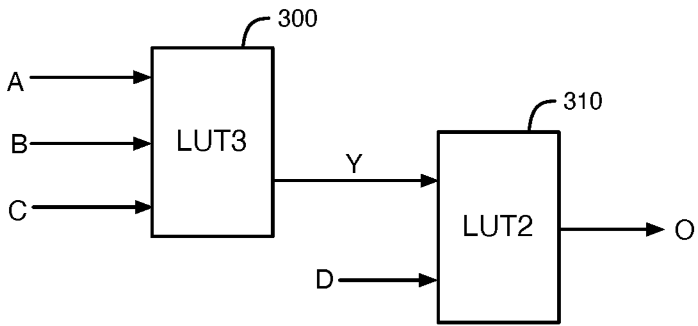
FIG. 3C is a diagram that illustrates examples of two lookup table (LUT) circuits that can replace a single larger LUT circuit in a circuit design for an ASIC during a post processing optimization procedure.

FIG. 3C is a diagram that illustrates examples of two lookup table (LUT) circuits that can replace a single larger LUT circuit in a circuit design for an ASIC during a post processing optimization procedure. In the example of FIG. 3C, the redaction system 100 of FIG. 1 initially replaces logic circuits in a module in a circuit design for an ASIC with a 4-input LUT circuit. Then, redaction system 100 determines if it is possible and/or feasible to replace the 4-input LUT circuit with the 3-input LUT circuit 300 of FIG. 3A and the 2-input LUT circuit 310 of FIG. 3B (coupled as shown in FIG. 3C) in the circuit design during a post processing optimization procedure. If the redaction system 100 determines that it is possible/feasible to replace the 4-input LUT circuit with the LUT circuits shown in FIG. 3C, then the redaction system 100 can decide to make this replacement. The output of LUT circuit 300 that generates the Y output signal is coupled to the Y input of the LUT circuit 310, as shown in FIG. 3C, to generate a replacement for the 4-input LUT circuit. The resulting LUT structure including LUT circuits 300 and 310 coupled as shown in FIG. 3C can perform the same functions as the single 4-input LUT circuit. The LUT circuits 300 and 310 as shown in FIG. 3C have less register circuits and multiplexer circuits (i.e., 12 register circuits and 10 multiplexer circuits as shown in FIGS. 3A-3B) than a single 4-input LUT circuit, which has 16 register circuits and 15 multiplexer circuits. Therefore, the LUT structure of FIG. 3C uses less die area in the ASIC and consumes less power.

Figure 4:
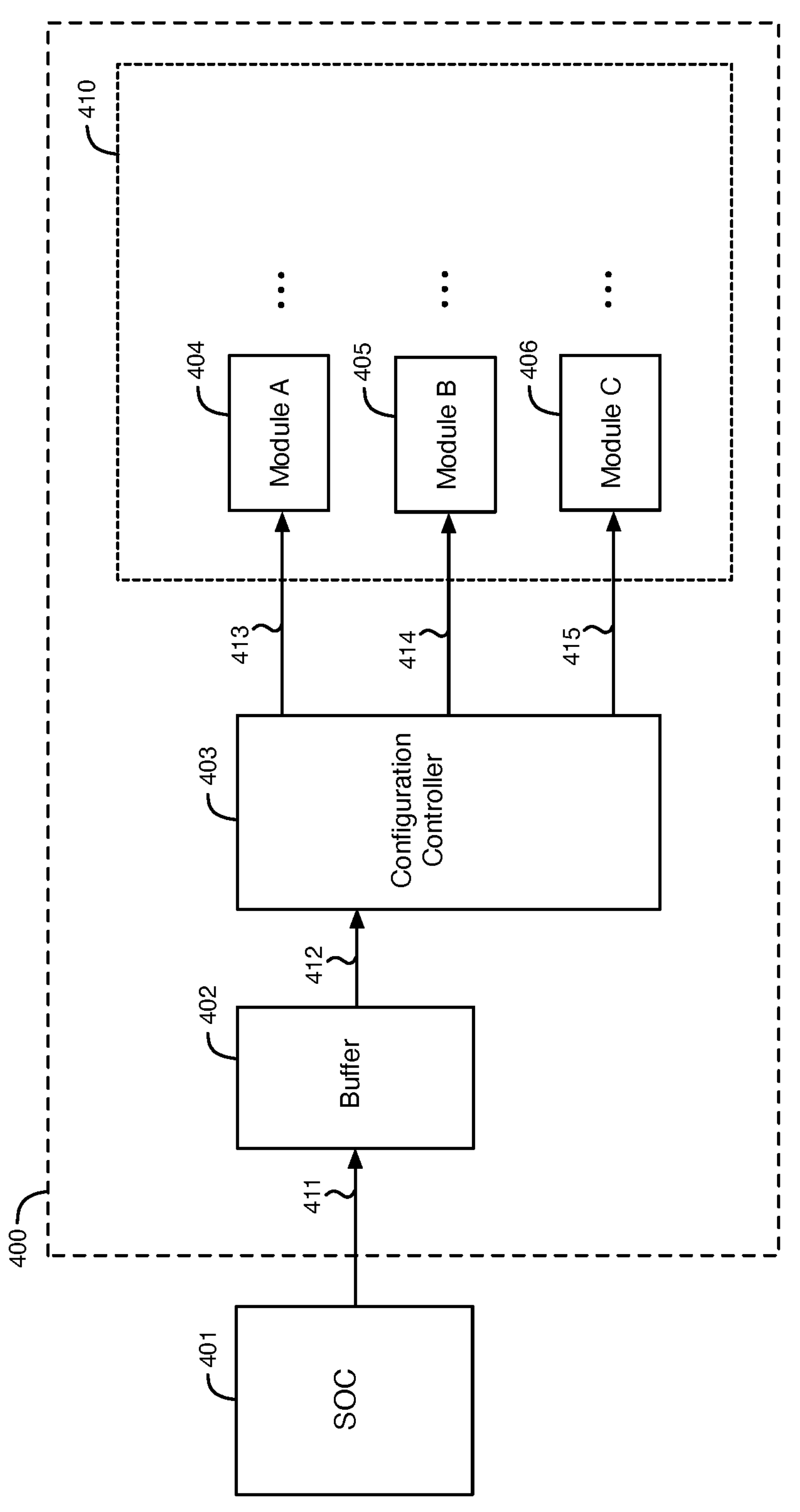
FIG. 4 is a diagram that illustrates an example of an application specific integrated circuit (ASIC) that includes modules of logic circuits that have been redacted using the redaction system of FIG. 1.

FIG. 4 is a diagram that illustrates an example of an application specific integrated circuit (ASIC) 400 that includes modules of logic circuits that have been redacted using redaction system 100 of FIG. 1. The ASIC 400 of FIG. 4 includes a buffer circuit 402, a configuration controller circuit 403, and a fabric 410, including modules of logic circuits, such as module A 404, module B 405, and module C 406. The fabric 410 can also include additional modules of logic circuits not shown in FIG. 4. In the example of FIG. 4, the bitstreams generated by redaction system 100 are encrypted and stored in an external system-on-chip (SOC) 401. The bitstreams are decrypted and provided from SOC 401 to buffer circuit 402 through one or more paths 411. Buffer circuit 402 buffers the digital bits in the bitstreams to generate buffered bitstreams that are provided to configuration controller circuit 403 through one or more paths 412. Configuration controller circuit 403 loads the buffered bitstreams into the register circuits in the configurable circuits (e.g., LUTs) in the modules in fabric 410. For example, configuration controller circuit 403 loads one of the bitstreams into the register circuits in each of the modules 404-406 through a respective one of the paths 413-415. After the decrypted and buffered bitstreams are loaded into the modules and stored in the register circuits, the configurable circuits in the modules are configured by the bitstreams to perform the logic functions of the logic circuits replaced by redaction system 100 in the original design for the ASIC.

The redaction system 100 is able to prevent the logic functions of the configurable circuits in a circuit design for an ASIC from being discovered or reverse engineered by loading all zero bits into the register circuits in each of the configurable circuits. When the register circuits in the configurable circuits are loaded with all zero values, the circuit design for the ASIC is non-functional, and the functionality of the circuit design, including the logic functions of the configurable circuits, cannot be determined. The register circuits in the configurable circuits in the modules in an ASIC can be loaded with a functional bitstream or a bitstream with all zero values that render the circuit design for the ASIC non-functional. Loading an all zero bitstream into the register circuits in the configurable circuits in a module to make the module non-functional is referred to as zeroization. Zeroizing some or all of the modules in a circuit design for an ASIC can protect the circuit design from being ascertained by an untrusted party. Because the bitstream is removed during zeroization, any physical probing to inputs of the configurable circuits in the ASIC to recover the bitstream is prevented.

Figure 5:
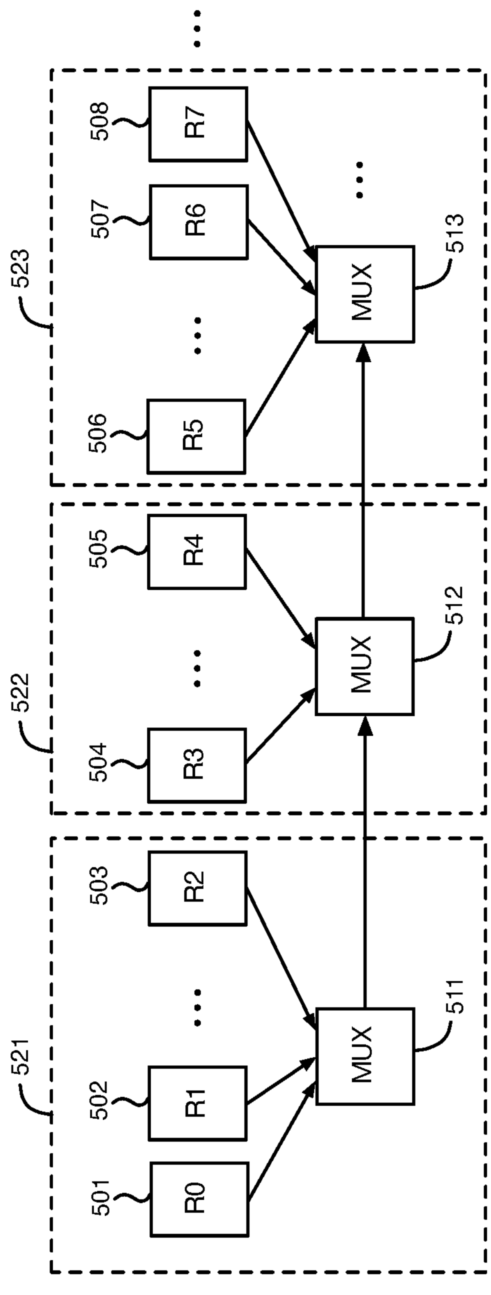
FIG. 5 is a diagram that illustrates examples of configurable circuits that include lookup table (LUT) circuits.

FIG. 5 is a diagram that illustrates examples of configurable circuits that include lookup table (LUT) circuits. The LUT circuits 521-523 of FIG. 5 can be used to replace logic circuits in the modules of a circuit design for an ASIC to redact the circuit design. The LUT circuits 521-523 of FIG. 5 include several register circuits, including register circuits 501-508, and several multiplexer circuits, including multiplexer (MUX) circuits 511-513. For example, the first LUT circuit 521 in FIG. 5 includes register circuits 501-503 and multiplexer circuits 511. The second LUT circuit 522 in FIG. 5 includes register circuits 504-505 and multiplexer circuits 512. The third LUT circuit 523 in FIG. 5 includes register circuits 506-508 and multiplexer circuits 513. The multiplexer circuits 511 provide an output signal to an input of multiplexer circuits 512, and multiplexer circuits 512 provides an output signal to an input of multiplexer circuits 513. Multiplexer circuits 511-513 also receive other input signals not shown in FIG. 5. The LUT circuits 521-523 shown in FIG. 5 can be zeroized by loading bits having all zero values into the register circuits, including into register circuits 501-508. When the LUT circuits of FIG. 5 are zeroized, the LUT circuits are redacted, such that the logic functions of the LUT circuits as configured cannot be determined. The LUT circuits 521-523 shown in FIG. 5 can be made to perform custom logic functions of a circuit design for the ASIC by loading one or more functional bitstreams into the register circuits, including into register circuits 501-508, that configure the LUT circuits to perform the custom logic functions.

Figure 6:
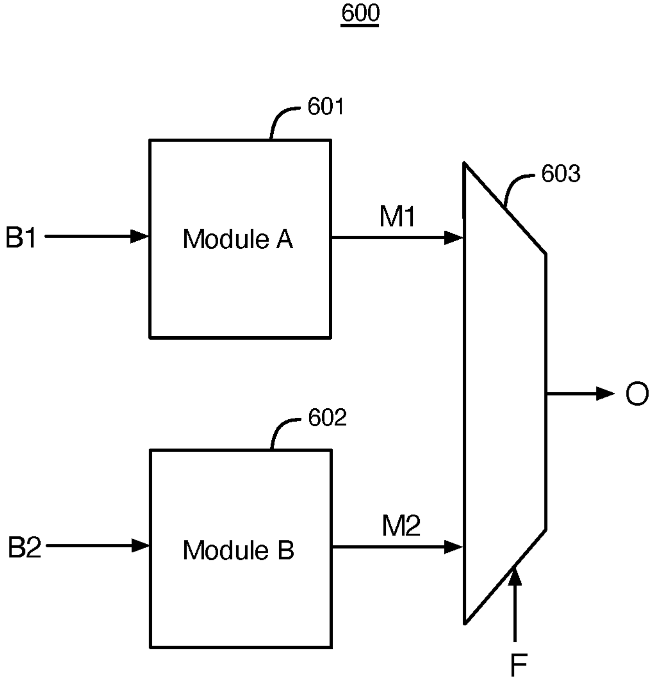
FIG. 6 is a diagram that illustrates an example of a redacted module that can selectively activate one of two alternative modules of configurable circuits for use in an application for an ASIC.

As other examples, redaction system 100 can replace the logic circuits in two or more modules in a circuit design for an ASIC with modules of configurable circuits that can be used as alternatives for different applications of the ASIC. A selected one of the modules with configurable circuits is loaded with a functional bitstream for a particular application and the other one or more modules of configurable circuits is zeroized. FIG. 6 is a diagram that illustrates an example of a redacted module 600 that can selectively activate one of two alternative modules of configurable circuits for use in an application for an ASIC. The redacted module 600 of FIG. 6 includes module A 601 of configurable circuits (e.g., LUT circuits), module B 602 of configurable circuits (e.g., LUT circuits), and multiplexer circuit 603.

The redacted module 600 can be configured to implement one of two different logic functions performed by modules 601 and 602. The two different logic functions can be implemented in two different applications for the ASIC. The first logic function can be implemented by loading a functional bitstream in signals B1 into module A 601 to configure module A 601 with the functional bitstream to perform the first logic function. In addition, a zeroized bitstream (all zero values) is loaded into module B 602 in signals B2 to disable module B 602. Multiplexer circuit 603 is configured by select signal F to implement the first logic function by selecting the output signal M1 of module A 601 and providing the value of signal M1 to output signal O of redacted module 600.

The second logic function can be implemented by loading a functional bitstream in signals B2 into module B 602 to configure module B 602 with the functional bitstream to perform the second logic function. In addition, a zeroized bitstream (all zero values) is loaded into module A 601 in signals B1 to disable module A 601. Multiplexer circuit 603 is configured by select signal F to implement the second logic function by selecting the output signal M2 of module B 602 and providing the value of signal M2 to output signal O of redacted module 600. The redacted module 600 provides design security for the zeroized module using configurable circuits (e.g., LUT circuits) that are redacted. The redacted module 600 also provides module level reconfigurability for the modules 601 and 602.

The ASICs disclosed herein can be designed to implement any suitable type of integrated circuit or system. The ASICs disclosed herein can be numerous types of devices such as processor integrated circuits, central processing units, memory integrated circuits, graphics processing unit integrated circuits, or application specific standard products (ASSPs).

The integrated circuits disclosed herein may be part of a data processing system that includes one or more of the following components: a processor; memory; input/output circuitry; and peripheral devices. The data processing system can be used in a wide variety of applications, such as computer networking, data networking, instrumentation, video processing, digital signal processing, or any suitable other application. The integrated circuits can be used to perform a variety of different logic functions.

In general, software and data for performing any of the functions disclosed herein can be stored in non-transitory computer readable storage media. Non-transitory computer readable storage media is tangible computer readable storage media that stores data and software for access at a later time, as opposed to media that only transmits propagating electrical signals (e.g., wires). The software code may sometimes be referred to as software, data, program instructions, instructions, or code. The non-transitory computer readable storage media can, for example, include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

The following additional examples are disclosed. Example 1 is a computer system for protecting a circuit design for an application specific integrated circuit, the computer system comprising: a logic circuit replacement tool for generating a transformed circuit design for the application specific integrated circuit by replacing first logic circuitry in a first module in at least a portion of the circuit design with a first configurable circuit that performs a logic function of the first logic circuitry when a first bitstream stored in first storage circuits in the first configurable circuit configures the first configurable circuit, wherein the transformed circuit design comprises the first configurable circuit in the first module.

In Example 2, the computer system of Example 1 may optionally include, wherein the first configurable circuit comprises a lookup-table circuit.

In Example 3, the computer system of any one of Examples 1-2 may optionally include, wherein the logic circuit replacement tool is configured to identify a second module of second logic circuitry for replacement in the circuit design, wherein the logic circuit replacement tool generates the transformed circuit design by replacing the second logic circuitry in the second module with a second configurable circuit that performs a logic function of the second logic circuitry when a second bitstream stored in second storage circuits in the second configurable circuit configures the second configurable circuit, and wherein the transformed circuit design comprises the second configurable circuit in the second module.

In Example 4, the computer system of Example 3 may optionally include, wherein the first module and the second module are arranged in a hierarchy of modules, and wherein the second module is a sub-module of the first module.

In Example 5, the computer system of any one of Examples 3-4 may optionally include, wherein the logic circuit replacement tool is configured to provide a multiplexer circuit in the transformed circuit design that is configurable to select an output signal of only one of the first configurable circuit or the second configurable circuit for transmission to additional modules in the transformed circuit design.

In Example 6, the computer system of any one of Examples 3-5 may optionally include, wherein the first configurable circuit comprises a first lookup table circuit, and wherein the second configurable circuit comprises a second lookup table circuit that is a different size than the first lookup table circuit.

In Example 7, the computer system of any one of Examples 1-6 may optionally include, wherein the logic circuit replacement tool generates the transformed circuit design by replacing the first configurable circuit with second configurable circuits that perform the logic function of the first logic circuitry when a second bitstream is stored in second storage circuits in the second configurable circuits and used to configure the second configurable circuits, and wherein the second configurable circuits combined are smaller than the first configurable circuit.

In Example 8, the computer system of any one of Examples 1-7 may optionally include, wherein the first configurable circuit is configurable to be prevented from being functional by loading all zero values into the first storage circuits.

In Example 9, the computer system of any one of Examples 1-8 may optionally include, wherein the first storage circuits are register circuits responsive to at least one clock signal.

Example 10 is a method for protecting a circuit design for an application specific integrated circuit, the method comprising: identifying a first module of first logic circuitry for replacement in at least a portion of the circuit design; and generating a transformed circuit design for the application specific integrated circuit by replacing the first logic circuitry with a first configurable circuit in the first module that performs a logic function of the first logic circuitry when a first bitstream is stored in first storage circuits in the first configurable circuit and configures the first configurable circuit.

In Example 11, the method of Example 10 further comprises: identifying a second module of second logic circuitry for replacement in the circuit design, and wherein generating the transformed circuit design further comprises replacing the second logic circuitry with a second configurable circuit in the second module that performs a logic function of the second logic circuitry when a second bitstream is stored in second storage circuits in the second configurable circuit and used to configure the second configurable circuit.

In Example 12, the method of Example 11 may optionally include, wherein generating the transformed circuit design further comprises providing a multiplexer circuit in the transformed circuit design that is configurable to select an output signal of only one of the first configurable circuit or the second configurable circuit for transmission to any additional modules in the transformed circuit design.

In Example 13, the method of any one of Examples 11-12 further comprises: zeroizing the first module by loading the first bitstream having all zero values into the first storage circuits; loading the second bitstream having functional values into the second storage circuits; and configuring the second configurable circuit with the second bitstream to perform the logic function of the second logic circuitry.

In Example 14, the method of any one of Examples 11-13 may optionally include, wherein generating the transformed circuit design further comprises replacing the first logic circuitry with a first lookup table circuit, and replacing the second logic circuitry with a second lookup table circuit that is a different size than the first lookup table circuit.

In Example 15, the method of any one of Examples 10-14 may optionally include, wherein generating the transformed circuit design further comprises generating an additional transformed circuit design for the application specific integrated circuit by replacing the first configurable circuit with second configurable circuits that perform the logic function of the first logic circuitry when a second bitstream is stored in second storage circuits in the second configurable circuits and configures the second configurable circuits, and wherein the second configurable circuits collectively are smaller than the first configurable circuit.

Example 16 is a non-transitory computer-readable storage medium comprising instructions stored thereon for causing a computer system to execute a method for protecting a circuit design for an application specific integrated circuit, the method comprising: replacing a first logic circuit in a first module in the circuit design with a first configurable circuit that performs a logic function of the first logic circuit when a first bitstream stored in first storage circuits in the first configurable circuit configures the first configurable circuit; and generating a transformed circuit design for the application specific integrated circuit that comprises the first configurable circuit in the first module.

In Example 17, the non-transitory computer-readable storage medium of Example 16 may optionally include, wherein the method further comprises: replacing a second logic circuit in a second module in the circuit design with a second configurable circuit that performs a logic function of the second logic circuit when a second bitstream stored in second storage circuits in the second configurable circuit configures the second configurable circuit, and wherein generating the transformed circuit design further comprises generating the transformed circuit design that comprises the second configurable circuit in the second module.

In Example 18, the non-transitory computer-readable storage medium of Example 17 may optionally include, wherein generating the transformed circuit design further comprises providing a multiplexer circuit in the transformed circuit design that is configurable to select an output signal of only one of the first configurable circuit or the second configurable circuit for transmission to any additional modules of logic circuits in the transformed circuit design.

In Example 19, the non-transitory computer-readable storage medium of any one of Examples 16-18 may optionally include, wherein generating the transformed circuit design further comprises replacing the first logic circuit with the first configurable circuit that is configurable to be made non-functional by loading all zero values into the first storage circuits.

In Example 20, the non-transitory computer-readable storage medium of any one of Examples 16-19 may optionally include, wherein the method further comprises: replacing the first configurable circuit with second configurable circuits that perform the logic function of the first logic circuit when a second bitstream is stored in second storage circuits in the second configurable circuits and configures the second configurable circuits, wherein the second configurable circuits combined are smaller than the first configurable circuit, and wherein generating the transformed circuit design further comprises generating an additional transformed circuit design that comprises the second configurable circuits in the first module.

Example 21 is an integrated circuit comprising: a first module comprising a first configurable circuit that performs a first logic function when a first bitstream stored in first storage circuits in the first configurable circuit configures the first configurable circuit, wherein the first configurable circuit is coupled to receive a signal through hardwired routing.

In Example 22, the integrated circuit of Example 21 further comprises: a second module comprising a second configurable circuit that performs a second logic function when a second bitstream stored in second storage circuits in the second configurable circuit configures the second configurable circuit, wherein the first configurable circuit is coupled to the second configurable circuit through the hardwired routing.

In Example 23, the integrated circuit of Example 22 further comprises: a multiplexer circuit that is configurable to select an output signal of only one of the first configurable circuit or the second configurable circuit for transmission to a third module of logic circuits in the integrated circuit.

In Example 24, the integrated circuit of Example 22, wherein the second module is a sub-module of the first module in a hierarchy.

In Example 25, the integrated circuit of Example 22, wherein the first configurable circuit comprises a first lookup table circuit, and wherein the second configurable circuit comprises a second lookup table circuit that is a different size than the first lookup table circuit.

The foregoing description of the examples has been presented for the purpose of illustration. The foregoing description is not intended to be exhaustive or to be limiting to the examples disclosed herein. In some instances, features of the examples can be employed without a corresponding use of other features as set forth. Many modifications, substitutions, and variations are possible in light of the above teachings.

What is claimed is:

1. A computer system for protecting a circuit design for an application specific integrated circuit, the computer system comprising:

a logic circuit replacement tool for generating a transformed circuit design for the application specific integrated circuit by replacing first logic circuitry in a first module in at least a portion of the circuit design with a first configurable circuit that performs a first logic function of the first logic circuitry when a first bitstream stored in first storage circuits in the first configurable circuit configures the first configurable circuit to perform the first logic function, wherein the first configurable circuit cannot perform the first logic function without the first bitstream stored in the first storage circuits, and wherein the transformed circuit design comprises the first configurable circuit comprising the first storage circuits in the first module.

2. The computer system of claim 1, wherein the first configurable circuit comprises a lookup-table circuit.

3. The computer system of claim 1, wherein the logic circuit replacement tool is configured to identify a second module of second logic circuitry for replacement in the circuit design, wherein the logic circuit replacement tool generates the transformed circuit design by replacing the second logic circuitry in the second module with a second configurable circuit that performs a second logic function of the second logic circuitry only when a second bitstream stored in second storage circuits in the second configurable circuit configures the second configurable circuit to perform the second logic function, wherein the second configurable circuit cannot perform the second logic function without the second bitstream stored in the second storage circuits, and wherein the transformed circuit design comprises the second configurable circuit comprising the second storage circuits in the second module.

4. The computer system of claim 3, wherein the first module and the second module are arranged in a hierarchy, and wherein the second module is a sub-module of the first module.

5. The computer system of claim 3, wherein the logic circuit replacement tool is configured to provide a multiplexer circuit in the transformed circuit design that is configurable to select an output signal of only one of the first configurable circuit or the second configurable circuit for transmission to a third module in the transformed circuit design.

6. The computer system of claim 3, wherein the first configurable circuit comprises a first lookup table circuit, and wherein the second configurable circuit comprises a second lookup table circuit that is a different size than the first lookup table circuit.

7. The computer system of claim 1, wherein the logic circuit replacement tool generates the transformed circuit design by replacing the first configurable circuit with second configurable circuits that perform the first logic function of the first logic circuitry when a second bitstream is stored in second storage circuits in the second configurable circuits and used to configure the second configurable circuits, and wherein the second configurable circuits combined are smaller than the first configurable circuit.

8. The computer system of claim 1, wherein the first configurable circuit is configurable to be prevented from being functional by loading all zero values into the first storage circuits.

9. The computer system of claim 1, wherein the first storage circuits are register circuits responsive to at least one clock signal.

10. A method for protecting a circuit design for an application specific integrated circuit, the method comprising:

identifying a first module of first logic circuitry for replacement in at least a portion of the circuit design; and generating a transformed circuit design for the application specific integrated circuit using a logic circuit replacement tool by replacing the first logic circuitry with a first configurable circuit in the first module that performs a first logic function of the first logic circuitry only when a first bitstream is stored in first storage circuits in the first configurable circuit and configures the first configurable circuit to perform the first logic function, wherein the transformed circuit design comprises the first configurable circuit comprising the first storage circuits in the first module.

11. The method of claim 10 further comprising:

identifying a second module of second logic circuitry for replacement in the circuit design, and wherein generating the transformed circuit design further comprises replacing the second logic circuitry with a second configurable circuit in the second module that performs a second logic function of the second logic circuitry when a second bitstream is stored in second storage circuits in the second configurable circuit and used to configure the second configurable circuit to perform the second logic function.

12. The method of claim 11, wherein generating the transformed circuit design further comprises providing a multiplexer circuit in the transformed circuit design that is configurable to select an output signal of only one of the first configurable circuit or the second configurable circuit for transmission to a third module in the transformed circuit design.

13. The method of claim 11 further comprising:

zeroizing the first module by loading the first bitstream having all zero values into the first storage circuits;

loading the second bitstream having functional values into the second storage circuits; and configuring the second configurable circuit with the second bitstream to perform the second logic function of the second logic circuitry.

14. The method of claim 11, wherein generating the transformed circuit design further comprises replacing the first logic circuitry with a first lookup table circuit, and replacing the second logic circuitry with a second lookup table circuit that is a different size than the first lookup table circuit.

15. The method of claim 10, wherein generating the transformed circuit design further comprises generating a redacted circuit design for the application specific integrated circuit by replacing the first configurable circuit with second configurable circuits that perform the first logic function of the first logic circuitry when a second bitstream is stored in second storage circuits in the second configurable circuits and configures the second configurable circuits, and wherein the second configurable circuits collectively are smaller than the first configurable circuit.

16. An integrated circuit comprising:

a first module comprising a first configurable circuit that performs a first logic function of first logic circuitry when a first bitstream stored in first storage circuits in the first configurable circuit configures the first configurable circuit to perform the first logic function, wherein the first configurable circuit cannot perform the first logic function without the first bitstream stored in the first storage circuits, wherein a logic circuit replacement tool replaces the first logic circuitry in the first module in at least a portion of a circuit design for the integrated circuit with the first configurable circuit to generate a transformed circuit design for the integrated circuit, wherein the transformed circuit design comprises the first configurable circuit comprising the first storage circuits, and wherein the integrated circuit is an application specific integrated circuit.

17. The integrated circuit of claim 16 further comprising:

a second module comprising a second configurable circuit that performs a second logic function of second logic circuitry only when a second bitstream stored in second storage circuits in the second configurable circuit configures the second configurable circuit to perform the second logic function, wherein the first configurable circuit is coupled to the second configurable circuit through hardwired routing, and wherein the logic circuit replacement tool replaces the second logic circuitry in the second module in the circuit design with the second configurable circuit to generate the transformed circuit design.

18. The integrated circuit of claim 17 further comprising:

a multiplexer circuit that is configurable to select an output signal of only one of the first configurable circuit or the second configurable circuit for transmission to a third module of logic circuits in the integrated circuit.

19. The integrated circuit of claim 17, wherein the second module is a sub-module of the first module in a hierarchy.

20. The integrated circuit of claim 17, wherein the first configurable circuit comprises a first lookup table circuit, and wherein the second configurable circuit comprises a second lookup table circuit that is a different size than the first lookup table circuit.

* * * * *